(12) United States Patent
Trinh et al.

(10) Patent No.: US 11,479,849 B2
(45) Date of Patent: Oct. 25, 2022

(54) PHYSICAL VAPOR DEPOSITION CHAMBER WITH TARGET SURFACE MORPHOLOGY MONITOR

(71) Applicant: Taiwan Semiconductor Manufacturing Co., Ltd., Hsin-Chu (TW)

(72) Inventors: Hai-Dang Trinh, Hsinchu (TW); Chii-Ming Wu, Taipei (TW); Shing-Chyang Pan, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

(21) Appl. No.: 16/429,187

(22) Filed: Jun. 3, 2019

(65) Prior Publication Data
US 2020/0377997 A1 Dec. 3, 2020

(51) Int. Cl.
*C23C 14/54* (2006.01)
*G06N 20/00* (2019.01)
*C23C 14/35* (2006.01)

(52) U.S. Cl.
CPC .............. *C23C 14/54* (2013.01); *C23C 14/35* (2013.01); *G06N 20/00* (2019.01)

(58) Field of Classification Search
CPC .......... G06N 20/00; C23C 14/54; C23C 14/35
See application file for complete search history.

(56) References Cited

U.S. PATENT DOCUMENTS

| 4,466,872 A * | 8/1984 | Einbinder ............... C23C 14/54 |
| | | 118/664 |
| 2005/0006222 A1* | 1/2005 | Ding ................... C23C 14/3457 |
| | | 204/192.1 |

(Continued)

FOREIGN PATENT DOCUMENTS

| JP | 2004360036 A | * 12/2004 |
| JP | 2008088500 A | * 4/2008 |
| KR | 101288131 B1 | * 7/2013 |

OTHER PUBLICATIONS

Hariyama, Tatsuo, High-accuracy range-sensing system based on FMCW using low-cost VCSEL, Apr. 2, 2018, Optics Express, vol. 26, No. 7 (Year: 2018).*

(Continued)

*Primary Examiner* — Jennifer Wecker
*Assistant Examiner* — Patrick S Ott
(74) *Attorney, Agent, or Firm* — Eschweiler & Potashnik, LLC

(57) ABSTRACT

A sputtering system includes a vacuum chamber, a power source having a pole coupled to a backing plate for holding a sputtering target within the vacuum chamber, a pedestal for holding a substrate within the vacuum chamber, and a time of flight camera positioned to scan a surface of a target held to the backing plate. The time of flight camera may be used to obtain information relating to the topography of the target while the target is at sub-atmospheric pressure. The target information may be used to manage operation of the sputtering system. Managing operation of the sputtering system may include setting an adjustable parameter of a deposition process or deciding when to replace a sputtering target. Machine learning may be used to apply the time of flight camera data in managing the sputtering system operation.

20 Claims, 5 Drawing Sheets

(56) References Cited

U.S. PATENT DOCUMENTS

| | | | |
|---|---|---|---|
| 2005/0139467 A1* | 6/2005 | Takahashi | H01J 37/3497 |
| | | | 204/298.11 |
| 2006/0081459 A1* | 4/2006 | Tsai | C23C 14/35 |
| | | | 204/192.13 |
| 2007/0228551 A1* | 10/2007 | Ishikawa | H01S 5/06258 |
| | | | 257/701 |
| 2017/0123067 A1* | 5/2017 | Van Der Tempel | G01S 7/4876 |
| 2017/0184450 A1* | 6/2017 | Doylend | G01S 7/4817 |
| 2017/0272731 A1* | 9/2017 | Kashyap | G01S 17/87 |
| 2018/0061696 A1* | 3/2018 | D'Ambra | H01L 21/6833 |

OTHER PUBLICATIONS

Achuta, Kadambi, Rethinking Machine Vision Time of Flight with GHz Heterodyning, 2017, Massachusetts Institute of Technology (Year: 2017).*
JP-2004360036-A Machine Translation (Year: 2004).*
KR-101288131-B1 Machine Translation (Year: 2013).*
JP-2008088500-A Translation (Year: 2008).*
Kadambi et al. "Rethinking Machine Vision Time of Flight With GHz Heterodyning." Published in: IEEE Access (vol. 5), published on Nov. 17, 2017.
Hariyama et al. "High-Accuracy Range-Sensing System Based on FMCW Using Low-Cost VCSEL." Optics Express, vol. 26, No. 7, Apr. 2, 2018. Published on Mar. 30, 2018.

\* cited by examiner

PHYSICAL VAPOR DEPOSITION CHAMBER WITH TARGET SURFACE MORPHOLOGY MONITOR

BACKGROUND

Physical vapor deposition (PVD), also called sputtering, is widely used in the semiconductor industry to form thin films. A typical sputtering system includes a vacuum chamber, a high voltage DC power source, a backing plate configured to hold a target, and a pedestal configured to hold a substrate. The backing plate is coupled to the high voltage DC power source whereby the target on to backing plate provides a cathode. In some instances, the backing plate is also coupled to a radio frequency (RF) power source. The substrate on the pedestal provides an anode. The chamber is evacuated and then backfilled with process gas at reduced pressure. A glow discharge between the cathode and the anode generates a plasma of positive ions from the process gas. The positive ions accelerate toward and bombard the target causing atoms of the source material to be ejected. Some of the ejected atoms deposit on the substrate to form a thin film of the source material.

Increasing the process gas pressure in the vacuum chamber increases the sputtering rate but also reduces the mean free path of sputtered atoms, which can be undesirable. Magnetron sputtering provides a means of increasing the sputtering rate without increasing process gas pressure. In magnetron sputtering, a magnetic field is positioned to increase the path length of free electrons in the chamber, which increases the extent to which these electrons interact with process gases, which increases the plasma generation rate. This results in a higher plasma concentration and a higher sputtering rate for a given chamber pressure.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

DETAILED DESCRIPTION

Figure 1:
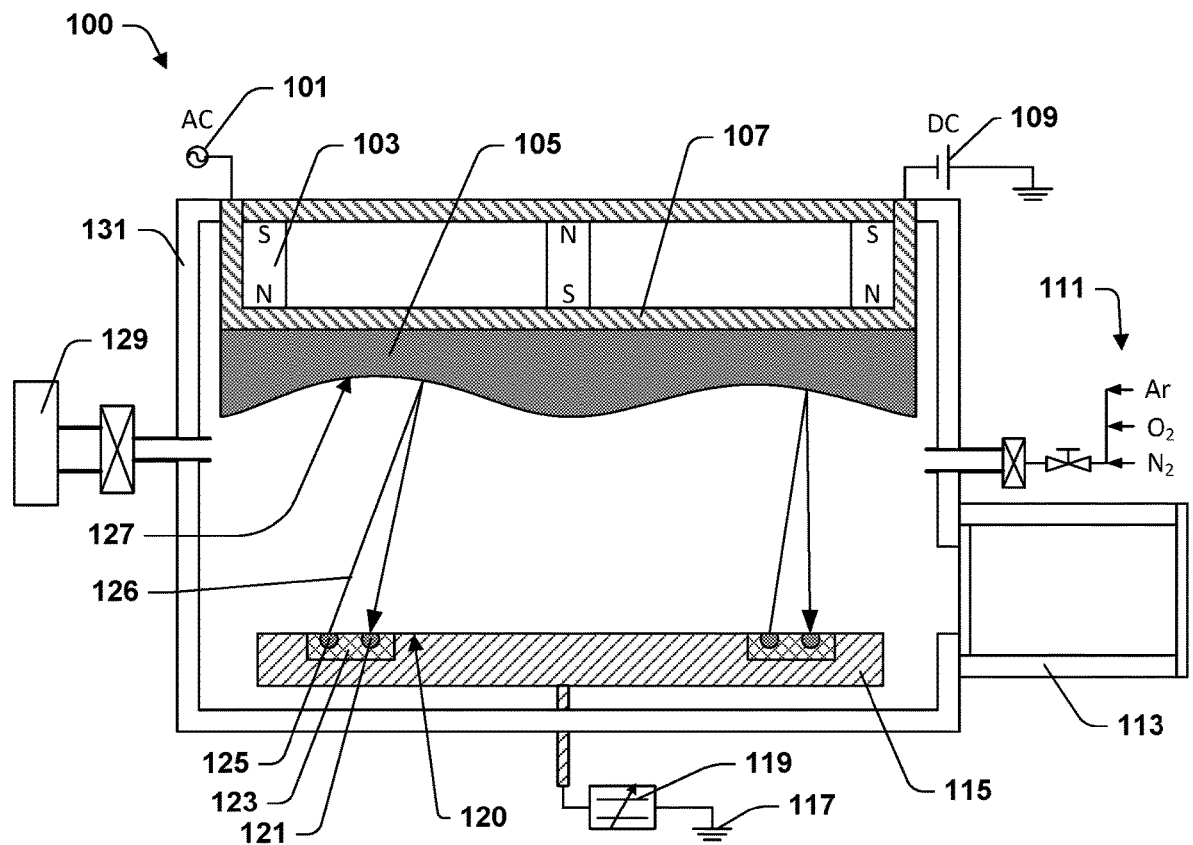
FIG. 1 illustrates a cross-sectional view of a sputtering system according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly.

PVD process objectives include the production of consistent, quality coatings while maximizing throughput and minimizing cost. Consistency may relate to uniformity across a wafer, uniformity among multiple wafers in a batch, or batch-to-batch consistency. Consistency may be characterized with statistics relating to quality metrics. Quality metrics may relate to one or more of density of particle or pinhole defects, conformity to underlying topography, thickness, surface roughness, breakdown voltage, resistivity, stress, or the like in relation to specifications for any of these properties that are relevant in a given application. A PVD process may be tuned toward achieving a quality metric by adjusting one or more of the following deposition process parameters: the process gas pressure, the target-to-substrate distance, the process time, DC power, and where applicable, magnet positions, AC power, AC frequency, process gas composition, and the like.

An important consideration in balancing the achievement of a quality metric against throughout and cost is the decision of when to replace the target. In view of the cost of target material and the downtime associated with target replacement, it is highly desirable in terms of cost and throughout to reduce the frequency of target replacement. Achieving this objective is made more complicated by the fact that the target erodes non-uniformly, particularly in magnetron sputtering. In magnetron sputtering, magnetic fields cause a spatial variation in the target bombardment rate leading to evolution of a wavy target surface. If the target wears through completely at any one point, the backing plate is exposed and may sputter leading to contamination of substrates and the sputtering system. Target wear may also lead to arcing between the target and the substrate. Arcing refers to discharges that are high current and low voltage in comparison to the glow discharge that ionizes the process gas. The development of nodules, peeling, cracking, or other defects in the target may also necessitate maintenance or target replacement. Machine learning and other advanced process control techniques may be used to optimize the sputtering system operation in view of process objectives.

Some aspects of the present disclosure relate to a sputtering system equipped with a time of flight (TOF) camera positioned to scan a surface of a target housed in a vacuum chamber of the sputtering system. The TOF camera provides data relating to a topography of the target. The data may be used to improve management of the sputtering system's operation. In some of these teachings, the data is used to determine when to replace the target. In some of these teachings, the data is used to modify a deposition process parameter in relation to evolution of a target. In some of these teachings, the deposition process parameter relates to a distance between a substrate and the target. In some of these teachings, the data is used to modify a deposition process parameter while the vacuum chamber remains at sub-atmospheric pressure. In some of these teachings, the deposition process parameter is modified to maintain consistency in the quality of the coatings being produced by the sputtering system. In some of these teachings, the deposition process parameter is modified to prevent arcing. Modifying the deposition process parameter may involve an increase in processing time.

In some of these teachings, the sputtering system is a magnetron sputtering system. In a magnetron sputtering system, the TOF camera is particularly useful in optimizing target utilization. In some of these teachings, the sputtering system includes a load lock system that allows the substrates to be changed while the chamber remains at sub-atmospheric pressure. It is particularly useful to have the TOF camera data when preservation of the vacuum limits options for assessing the target condition. In some of these teachings, the TOF camera is mounted inside the vacuum chamber. In some of these teachings, the TOF camera is mounted to a pedestal for holding a substrate. In some of these teachings, a line of sight between the TOF camera and the target is blocked while sputtering is taking place. In some of these teachings, the TOF camera is mounted to the pedestal in such a way that a substrate held to the pedestal will cover the TOF camera while sputtering is taking place. In some of these teachings, the TOF camera is recessed behind a substrate-holding surface of the pedestal. The substrate may then protect the camera from sputtering and the target surface may be scanned by the TOF camera while substrates are being changed. Alternatively, the TOF camera may be positioned outside of the vacuum chamber and may scan the target through a view port provided in a vacuum chamber wall.

Some aspects of the present teachings relate to forming a model that relates TOF camera-generated data to coating data and using that model to help manage operation of the sputtering system. The method may include generating training data, developing a model using that data, and applying the model in operating the sputtering system. The training data includes TOF camera-generated target data and coating data. The coating data may include one or more coating quality metrics. In some of these teachings, the training data includes one or more adjustable deposition process parameters.

Developing the model may include creating a model or tuning a model. In some of these teaching, the model is a probabilistic dependency model. A probabilistic dependency model may be a Bayesian network model, an artificial neural network, or the like. A probabilistic dependency model may provide a probability of achieving a successful coating result under given conditions. In some of these teaching, the model is a non-probabilistic model. A non-probabilistic model may be an expert system, a support vector network, or the like. A non-probabilistic model may provide a binary prediction of whether coating will be successful or not under given conditions.

In some of these teachings, the target condition is characterized using the TOF camera data. In some of these teachings, the parameters that characterize the target condition are determined as part of the model development process. For example, forming a Bayesian network model may include optimization of the number and identities of parameters used to characterize the target condition.

Figure 2:
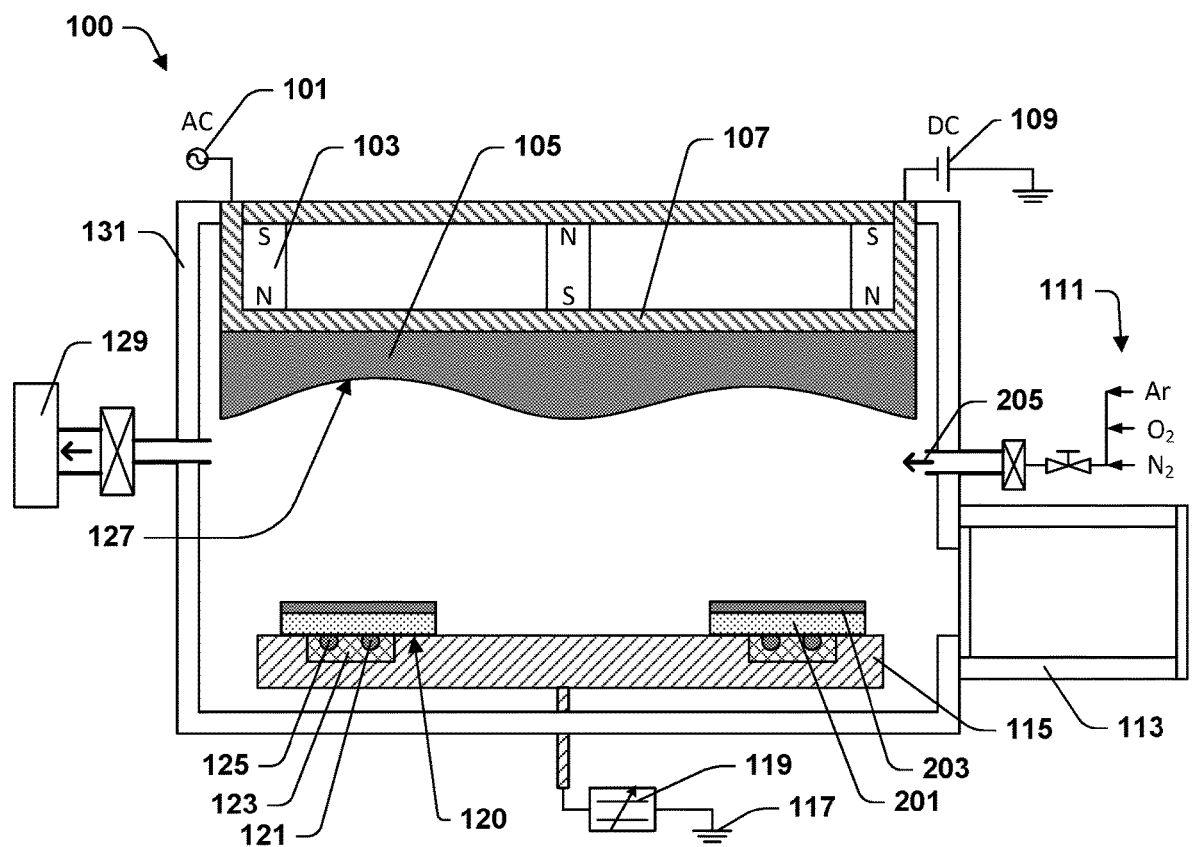
FIG. 2 illustrates the sputtering system of FIG. 1 during a deposition run.

FIGS. 1 and 2 illustrates a sputtering system 100 in accordance with some aspects of the present teaching. Sputtering system 100 includes a vacuum chamber 131, a high voltage DC power source 109, a backing plate 107 configured to hold a target 105, and a pedestal 115 configured to hold substrates 201 (see FIG. 2). Backing plate 107 is coupled to high voltage DC power source 109 whereby target 105 may act as a cathode for a glow discharge between target 105 and substrates 201. Backing plate 107 is also coupled to a radio frequency (RF) power source 101. Sputtering system 100 is a magnetron sputtering system and includes magnets 103 behind backing plate 107 Substrates 201 are coupled to ground 117 through pedestal 115 and variable capacitor 119. A vacuum pumping system 129 is operative to evacuate vacuum chamber 131. Process gas supply 111 may be used to introduce process gases 205 into vacuum chamber 131. Load lock system 113 may be used to introduce or remove substrates 201 from vacuum chamber 131 while vacuum chamber 131 remains at sub-atmospheric pressure.

Time of flight (TOF) cameras 123 are mounted to pedestal 115. TOF cameras 123 are recessed behind substrate-holding surface 120 of the pedestal 115. As shown in FIG. 2, when TOF cameras 123 are mounted in this way they are blocked from line-of-sight with target 105 by substrates 201 while coatings 203 are being applied to substrates 201. As shown in FIG. 1, substrates 201 may be removed from vacuum chamber 131 to allow a surface 127 of target 105 to be scanned by TOF cameras 123. It should be understood that "pedestal" is a term of art and that the structure used to support substrates 201 is described as pedestal 115 regardless of its shape, the spatial orientation of its supporting surface 120, or the mechanism by which substrates 201 are held in place on supporting surface 120.

Each TOF camera 123 may include an emitter 125, a sensor 121, and circuitry for determining a time-of-flight for photons traveling between emitter 125 and sensor 121 in beam 126. Any suitable TOF camera may be used. In some of these teachings, TOF camera 123 is a solid-state device. Emitter 125 may include a laser diode. In some of these teachings, emitter 125 includes a vertical-cavity surface-emitting laser (VCSEL). TOF cameras 123 may be operative to scan beam 126 over a surface 127 of target 105. The structure for varying the direction of beam 126 may include a heater operative to vary a refractive index in a waveguide. Given the direction of beam 126, the time-of-flight of photons in beam 126, and the speed of light, the circuitry is able to determine distance from TOF camera 123 of points on surface 127 off which portions of beam 126 reflect prior to striking sensor 121. In some of these teachings, sensor 121 includes an array of individual pixels, each receiving a different portion of beam 126. Beam 126 may be scanned over surface 127 to produce a topographical map. The map may be extended by combining data from several TOF cameras 123. In some of these teachings, TOF camera 123 has a small enough distance resolution to detect nodules on surface 127 of target 105 that could affect coatings 203. A small enough distance resolution to detect nodules is about 1 mm or less. In some of these teachings, the distance resolution is 100 μm or less. In some of these teachings, the distance resolution is 10 μm or less. In some of these teachings, the distance resolution is 3 μm or less.

TOF camera 123 may use any suitable mode of operation to obtain the desired resolution. In some of these teachings, TOF camera 123 is a correlation TOF imager. A correlation TOF imager may produce an amplitude modulated scanning beam 126 to increase resolution. Resolution may improve as the frequency of modulation increased. In some of these teachings, beam 126 is amplitude modulated at 1 GHz or more. In some of these teachings, the amplitude modulation is at 10 GHz or more. TOF camera 123 may produce a beam 126 modulated at these high frequencies using an emitter 125 having a laser that is amplitude modulated at a lower frequency. The lower frequency may be a frequency less than 500 MHz, for example, a frequency of about 120 MHz or less. In some of these teachings, a higher frequency beam 126 is produced from a lower frequency laser output by splitting the beam from the laser, creating a phase differential between the two portions of the split beam, then recombining the two portions. This may be accomplished, for example, with a Mach-Zehnder interferometers with a crystal in one arm or the like. In some of these teachings, a plurality of devices of that type are arranged in a cascade to provide beam 126 with the desired frequency.

In some of these teachings, the sensor 121 of TOF camera 123 includes a photodetector or like device having a bandwidth limit below the frequency of beam 126. Heterodyning may be used at the receiving end to encode the high frequency information in the reflected beam 126 as a lower frequency. Heterodyning may produce an input for a photodetector or like device that is within the device's bandwidth. This may be accomplished by splitting the received beam 126, creating a phase differential between the two portions of the split beam, then recombining the two portions. As for emitter 125, sensor 121 may accomplish this using a Mach-Zehnder interferometer with a crystal in one arm or the like. The resulting signal may have a beat note less than 100 Hz. In some embodiments, the beat note of the heterodyned signal is 10 Hz or less. These low frequency beat notes expand the range of devices that may be used to detect reflected beam 126 within sensor 121. In particular, a low frequency beat note may enable the use of a sensor 121 having a plurality of pixels.

Figure 3:
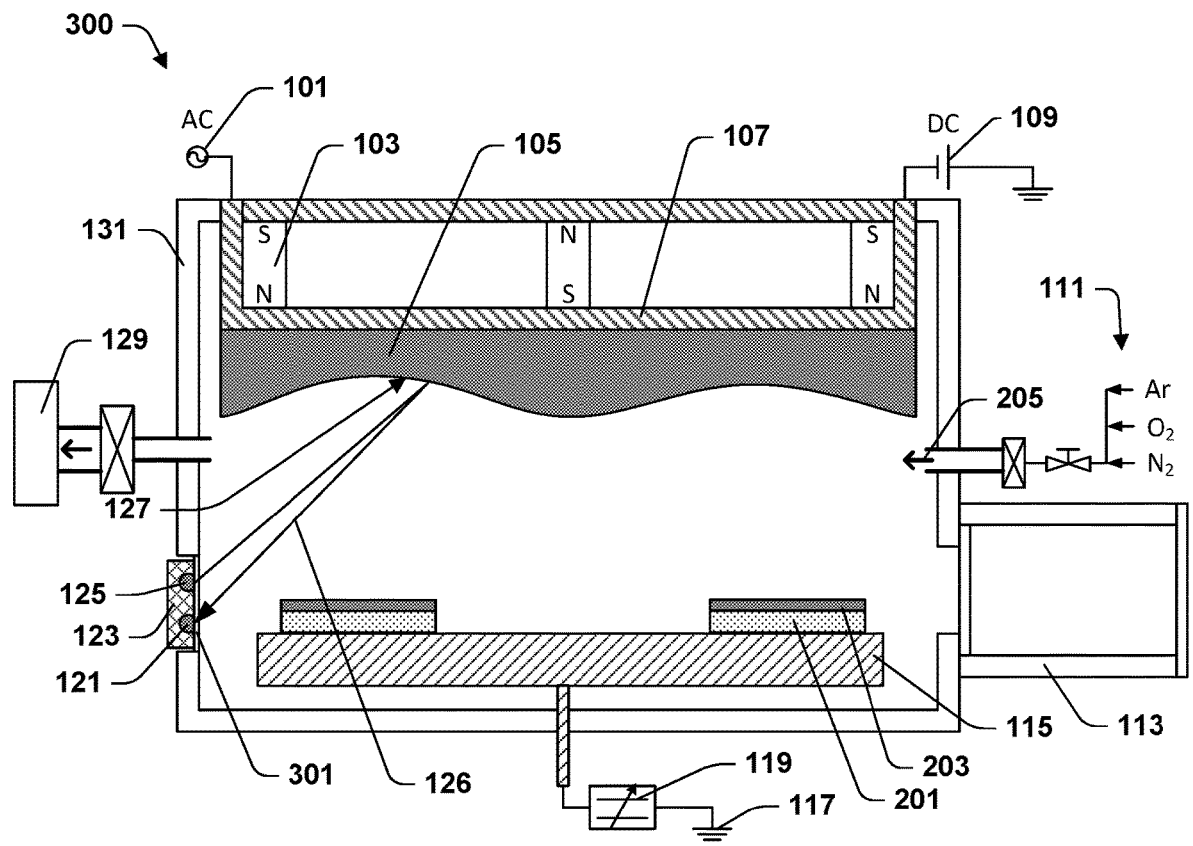
FIG. 3 illustrates a cross-sectional view of a sputtering system according to some other aspects of the present disclosure.

FIG. 3 illustrates a sputtering system 300 in accordance with some other aspects of the present teachings. Sputtering system 300 is generally similar in structure and operation to sputtering system 100 except that in sputtering system 300, TOF camera 123 is located outside vacuum chamber 131 and views target surface 127 through view port 301. View port 301 is transparent to a wavelength of beam 126.

Figure 4:
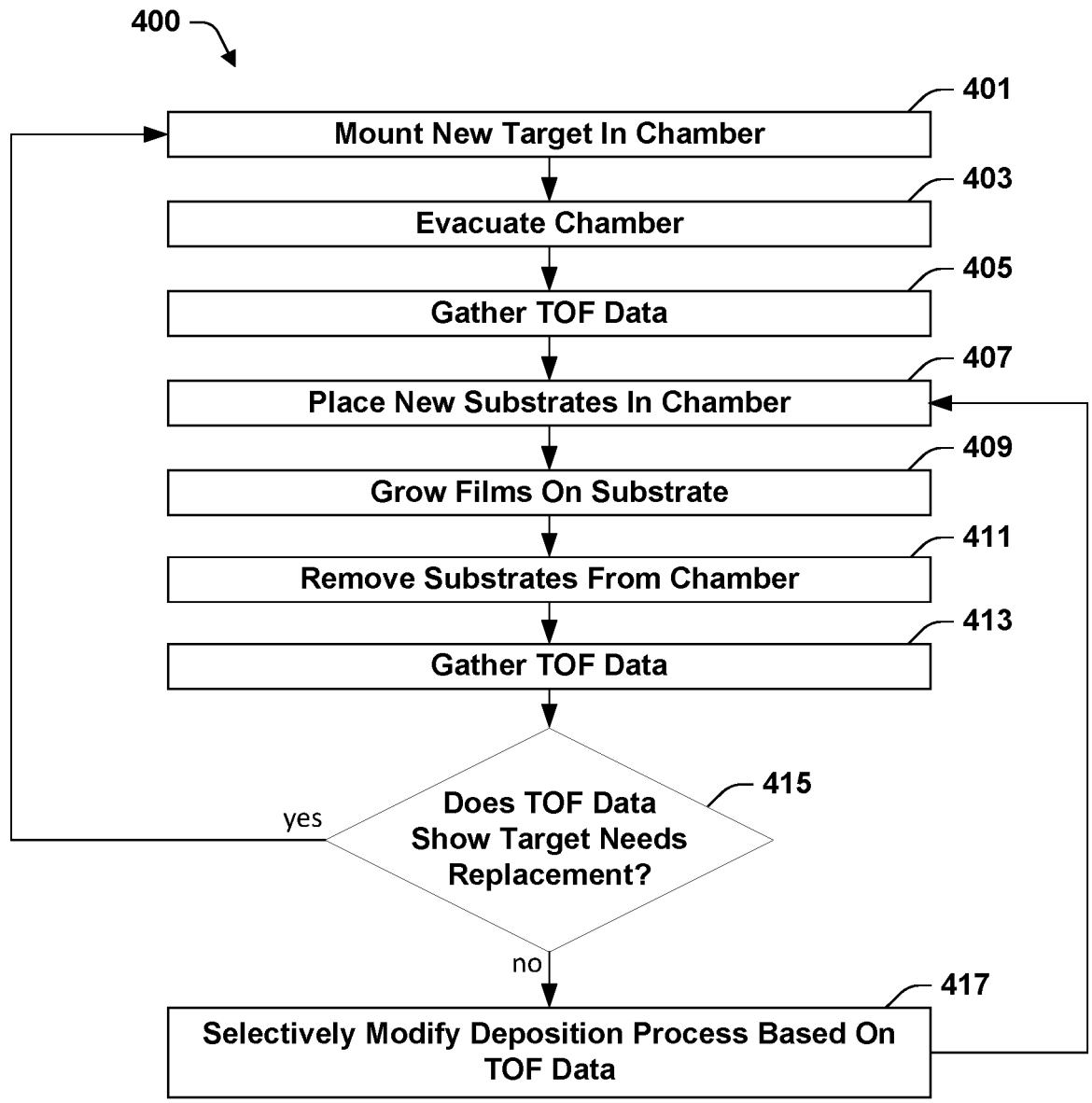
FIG. 4 provides a flow chart of a method according to some aspects of the present teachings.

FIG. 4 illustrates a method 400 in accordance with some aspects of the present teachings for operating a sputtering system. Method 400 will be described as it would be applied to sputtering system 100, although method 400 is also applicable to sputtering system 300 and other sputtering systems equipped with TOF cameras 123. Method 400 begins with act 401, providing sputtering system 100 with a new sputtering target 105. Target 105 may be mounted to backing plate 107 inside vacuum chamber 131. This operation may require disassembling sputtering system 100 and entail a significant downtime.

Target 105 may be any suitable sputtering target. In some embodiments, sputtering target 105 is a conductive metal or metal alloy. Sputtering target 105 may also be a dielectric. Target 105 may have any suitable shape. In some embodiments, target 105 is disc-shaped. In some of these teachings, target 105 has a planar surface 127 that is oriented towards pedestal 115. Target 105 may have any suitable size. In some embodiments, target 105 is from 2 mm to 50 mm thick. In some embodiments, target 105 is from 25 mm to 1000 mm in diameter.

Method 400 continues with act 403, evacuating chamber 131 using vacuum pumping system 129. Any suitable vacuum pumping system or combination of vacuum pumping systems may be used for this purpose. A suitable vacuum pumping system may include a mechanical pump and also a turbomolecular pump, a cryogenic pump, or the like. Act 403 may reduce the pressure in chamber 131 to less than 10-5 torr or to less than 10-6 torr.

Method 400 continues with act 405, obtaining data relating to a topography of surface 127 of target 105 using one or more TOF cameras 123. Obtaining the data may involve allowing TOF cameras 123 time to scan surface 127. If more than one TOF camera 123 is used, the scanning areas may overlap to improve the precision and accuracy of the topographical assessment. Precision may also be improved by repeating the scan and processing the repeated measurements with a suitable method, such as averaging or the like.

Method 400 continues with act 407, installing uncoated substrates 201 on pedestal 115 inside vacuum chamber 131. In some aspects of the present teachings, this is accomplished using load lock system 113 while vacuum chamber 131 remains at sub-atmospheric pressure. Substrates 201 may be placed in a circular array or any other suitable arrangement on one or more pedestals 115. In some of these teachings, substrates 201 are placed over TOF cameras 123 that are mounted to one or more pedestals 115.

Method 400 continues with act 409, growing coatings 203 on substrates 201. Growing coatings 203 includes flowing process gases 205 through vacuum chamber 131 while maintaining vacuum chamber 131 at a set pressure using vacuum pumping system 129, operating high voltage DC power source 109 and/or rf power source 101 to initiate a plasma-forming glow discharge, and maintain these conditions until coating 203 has reached a desired thickness. The process gas 205 typically includes argon. Additional gases, such as oxygen and/or nitrogen may also be included to provide a reactive deposition process.

Method 400 continues with act 411, removing substrates 201 from vacuum chamber 131. In some aspects of the present teachings, this is accomplished using load lock system 113 while vacuum chamber 131 remains at sub-atmospheric pressure. Coating 203 may then be evaluated against any specifications or metrics of quality or consistency.

Method 400 continues with act 413, which is again obtain data relating to a topography of surface 127 of target 105 using one or more TOF cameras 123. Act 413 may be the same as act 405. In some of these teachings, target 105 is scanned by TOF cameras 123 before and after each of the deposition runs represented by act 409. Alternative, scanning may be less frequent. For example, the scans may be made once for every two deposition runs or once every ten deposition runs.

Method 400 continues with act 415 where in accordance with some aspects of the present teachings, a decision is made whether to replace target 105 data based on the data obtained using TOF cameras 123. It is generally desirable to maximizes the lifetime of target 105, however, at some point target 105 will have eroded to an extent that coatings 203 within specification may no longer be reliably produced without replacing target 105. In some cases, it may still be possible to produce coatings 203 within specifications, but only if the deposition process parameters of act 409 are set in a way that makes the deposition process excessively slow or otherwise unacceptable. In either case, it may be deemed time to replace target 105.

The decision whether to replace target 105 based on the data obtained using TOF cameras 123 may be made by a human operator. For example, defects in coatings 203 may be noted or arcing in vacuum chamber 131 may be detected and inspection of a representation of the topography of target 105 using data obtained using TOF cameras 123 may confirm erosion of target 105 as the cause, which may prompt the decision to replace target 105. In some of these teachings, however, the processing of data obtained using TOF cameras 123 to make the decision whether to replace target 105 is automated and may be made by a computer system. In some of these teachings, the decision is made by comparing one or more characteristics of the topography of target 105 against a pre-determined standard. For example, the topography of target 105 may be used to determine a thickness of target 105 at its thinnest point. If that thickness is below a critical value, the decision may be made to replace target 105.

In some of these teachings, the decision whether to replace target 105 based on the data obtained using TOF cameras 123 involves the application of a predetermined relationship between a condition of target 105 that is evaluated in terms of the data and a coating that may be produced given the condition of target 105. In some of these teachings, that predetermined relationship includes one or more adjustable deposition process conditions. When the predetermined relationship includes one or more adjustable deposition process conditions, the determination whether to replace the target 105 may include a determination of whether one or more deposition process conditions can be adjusted within acceptable limits to produces the desired coatings given the current condition of target 105.

Method 400 may continue with act 417, selectively modifying one or more adjustable parameters of the deposition process based on the data obtained using TOF cameras 123. Act 417 is optional in the sense that methods according to the present teachings may include only act 415, determining whether target 105 needs to be replaced or only act 417, selectively modifying one or more adjustable parameters of the deposition process. On the other hand, a method according to the present teachings may include both act 415 and act 417.

Act 417 may include selectively modifying any suitable parameter or parameters of the deposition process. In some of these teachings, the adjusted parameters of the deposition process include a target to substrate distance. In some of these teachings, the adjusted parameters of the deposition process include a deposition process duration. In some of these teachings, the adjusted parameters of the deposition process include one or more of a pressure in vacuum chamber 131 and a power level for high voltage DC power source 109. Other parameters that may in some situations be adjusted include, without limitation, the positions of magnets 103, a voltage for high voltage DC power source 109, a power level for rf power source 101, a frequency for rf power source 101, the flow rates of one or more process gases 205, the setting of a variable capacitor 119, and a temperature at which substrates 201 are maintained by pedestal 115, and the like.

The deposition process parameters may be modified in view of any suitable objective. In some of these teachings, the objective of modifying the deposition process conditions includes reducing the deposition time to the extent that is consistent with other objectives. In some of these teachings, the objective of modifying the deposition process conditions includes maximizing the utilization of target 105 to the extent that is consistent with other objectives. In some of these teachings, maximizing the utilization of target 105 is maximizing the sputter yield. Sputtering yield is the fraction of material sputtered from target 105 that ends up in coatings 203 on substrates 201. On the other hand, maximizing the utilization of target 105 may include a more sophisticated measure of target utilization such as a rate of target waste. A rate of target waste is a measure of target 105's rate of approach to end-of-life and may include the effects of deposition process parameters on the erosion profile of target 105, the development of defects in target 105, or the like. In some of these teachings, the objective of modifying the deposition process conditions includes maximizing the probability of produces coatings within specifications to the extent that is consistent with other objectives. Modification of deposition process conditions in any of these ways is facilitated by having a predetermined relationship between a condition of target 105, the deposition process parameters being modified, and the effects of those variables on the relevant objectives.

Figure 5:
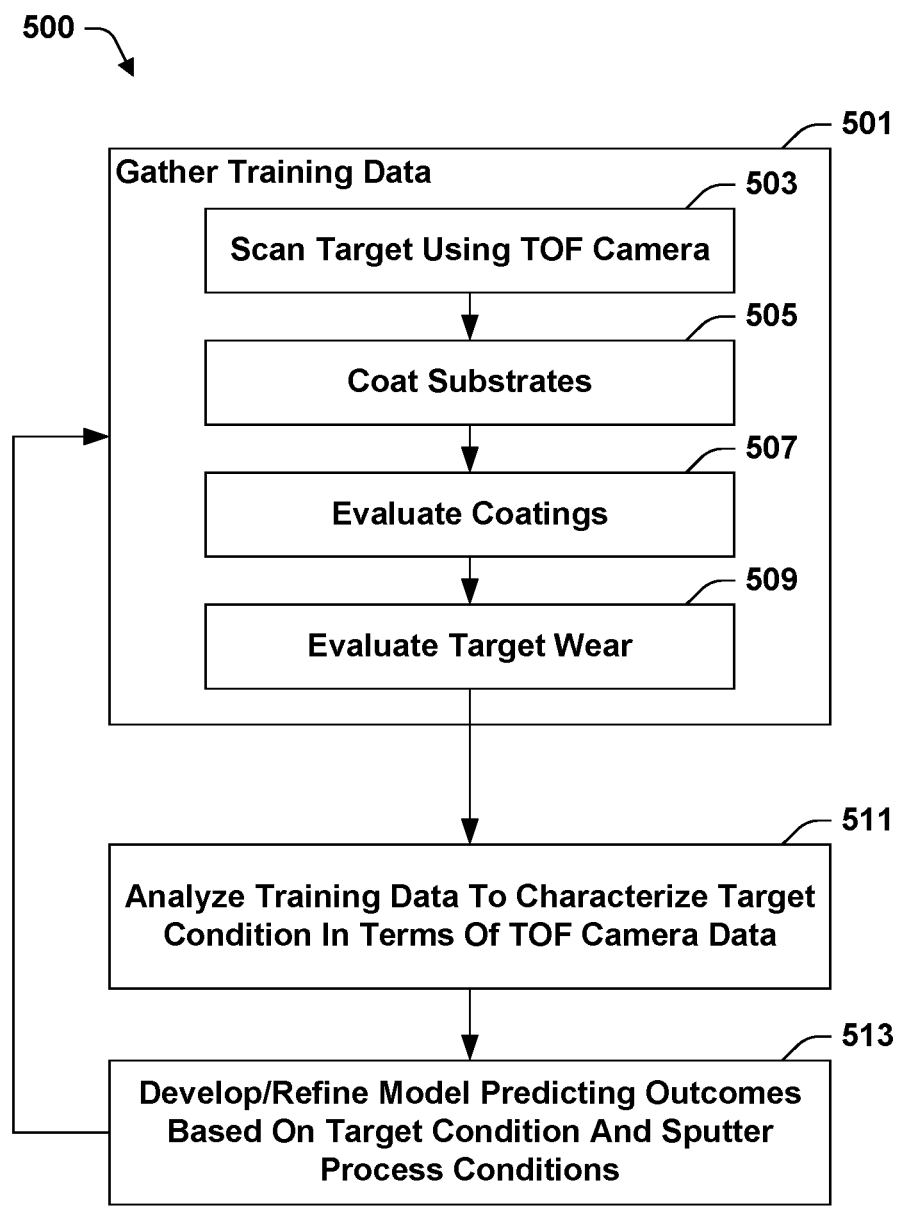
FIG. 5 provides a flow chart of a method according to some other aspects of the present teachings.

FIG. 5 illustrates a method 500 in accordance with some aspects of the present teachings for developing a predetermined relationship between model inputs that include a condition of target 105 reflected by data obtained using one or more TOF cameras 123 and a model output that relates to one or more objectives. The predetermined relationship may be described as a model and may be used to control operation of a sputtering system 100, 300 or some other sputtering system. The predetermined relationship may be used in method 400, for example. In some of these teachings, the model inputs include one or more adjustable deposition process parameters. The model outputs may include qualities of the coatings obtained under the input conditions, sputtering yield, target deterioration rate, combinations of the foregoing, or the like. Method 500 may be a machine learning process in which training examples are used to develop a predictive model.

Method 500 begins with act 501, gathering training examples. Act 501 includes act 503, gathering data by scanning a surface 127 of target 105 using one or more TOF cameras 123, act 505, operating the sputtering system 100, 300 to produce coatings 203, act 507, evaluating the resulting coatings 203, and optionally act 509, evaluating target wear. In some of these teachings, all the depositions are carried out using one sputtering system. This approach has the advantage that the resulting model may capture the idiosyncrasies of that sputtering system and may be particularly well suited for use in controlling that sputtering system. In some of these teachings, the depositions are carried out using a plurality of similar sputtering systems. This approach has the advantage of facilitating the collection of a large data set. Increasing the size of the data set may increase the predictive power of the resulting model.

In some of these teachings act 501, target 105 using one or more TOF cameras 123, is carried out with the one or more TOF cameras 123 installed at fixed locations in a sputtering system 100, 300. The fidelity and utility of the resulting predetermined relationship may be improved if the TOF cameras 123 are in the same locations for the collections of training data as they are when used to control operation of sputtering system 100, 300. Target 105 may be scanned before or after each deposition run. Using scans completed before a deposition run may be desirable in that the predetermined relationship may be used to predict a deposition outcome based on a scan of target 105 carried out before the deposition run. On the other hand, target 105 may evolve slowly and it may be sufficient to scan target 105 after runs or once every several runs.

Act 505, coating the substrates, includes recording the values of any adjustable deposition process parameters to be included as inputs to the predetermine relationship. The presence or absence of arcing may also be noted. Other adjustable deposition process parameters may be kept constant from run-to run. In some of these teachings, act 503 is repeated in a series of coating process runs with adjustable deposition process parameters varying in accordance with an experimental matrix. A particular point in the experimental matrix may be repeated many times to improve the ability of the data to reveal the effects of these parameters on wear and utilization of target 105. Some adjustable parameters that may be included in the experimental matrix are, without limitation, process gas pressure, target-to-substrate distance, process time, DC power, DC voltage, and where applicable, magnet positions, AC power, AC frequency, AC voltage, process gas flow rates, and the like.

Act 507, evaluating the coatings 203, may include evaluation of any suitable set of metrics. These metrics may include logical variables, such as whether a particular specification is met, continuous variables, such as a resistivity of the coating, or a combination of both types of parameters. The metrics may relate to one or more of density of particle or pinhole defects, conformity to underlying topography, thickness, surface roughness, breakdown voltage, resistivity, stress, or the like and may be determined as continuous variables or in terms of whether the values fall within specifications.

Act 509, evaluating wear of target 105, is optional in the sense that target end-of-life may be identified by the inability to produce coatings 203 meeting specifications. Accordingly, training data that does not explicitly include target failure may still be used to determine target end-of-life. Nevertheless, in some of these teachings the model is used to predict a target wear rate and the training data includes a measure of target wear. Obtaining a target wear rate may include repeating a deposition process at a particular point in the experimental matrix of adjustable process conditions until the target fails. Target failure may represent reaching a failure mode. One or more failure modes may be considered. One failure mode may be target 105 thinning to a particular degree at some point on surface 127. Another failure mode may be target 105 developing peaks that cause unavoidable arcing. Another failure mode may be target 105 developing surface defects that cause excessive defects in substrates 203.

Once the target fails, a wear rate may be assigned for all of the deposition process runs leading up to that failure. A disadvantage of this approach is that it may require many experiments to obtain a sufficient data set. The resulting model, however, may have a high degree of utility. For example, it is often the case that a deposition process rate can be increased by increasing the DC power, but if DC power is increased excessively, the target will undergo premature failure due to cracking, peeling, or the like. Including target wear rates in the training data enables the model to be used to optimize parameters, such as DC power, that might otherwise be set conservatively to avoid premature target failure.

Act 511 is characterizing the target condition in terms of TOF camera data. Act 511 represents the process by which a large quantity of data, such as a topographic representation, is reduced to a relatively small number of parameters for the purpose of modeling. Parameters used to characterize the condition of target 105 may be identified a prior. A priori parameters may include, for example, one or more of the thickness of target 105 at its thinnest point, a standard deviation of the height of the surface of target 105, and a measure of the roughness of surface 127 of target 105, or the like. In some embodiments, however, the model formation process includes optimizing the set of parameters used to characterize target 105. For example, a Bayesian network model may provide a mechanism for optimization the selection of target-characterizing parameters.

Act 513 is using the training data to develop the predetermined relationship or predictive model. This act may include the application of mathematical methods. The mathematical methods applied will depend on the machine learning technique. A well-known machine learning model and associated mathematical method may be used. In some of these teachings, the model is a probabilistic dependency model. A probabilistic dependency model may be a Bayesian network model, an artificial neural network, or the like. A probabilistic dependency model may provide a probability of achieving a successful coating. Given a target condition, various deposition process parameters may be run through the model to determine a set of parameters that minimizes processing time while keeping the probability of obtaining a successful coating at an acceptably high level subject to constraints such as a maximum permissible target wear rate. In some of these teaching, the model is a non-probabilistic model. A non-probabilistic model may be an expert system, a support vector network, or the like. A non-probabilistic model may provide a binary prediction of whether coating will be successful or not under given conditions. As with the probabilistic model, a computer system may be used to predict the effects of varying deposition process parameters and thereby optimize an objective, such as minimizing deposition time, subject to constraints.

Some aspects of the present teachings relate to a sputtering system that includes a vacuum chamber, a power source having a pole coupled to a backing plate for holding a sputtering target within the vacuum chamber, a pedestal for holding a substrate within the vacuum chamber, and a time of flight camera positioned to scan a surface of a target held to the backing plate. The time of flight camera may be used to obtain information relating to the topography of the target while the target is at sub-atmospheric pressure. The target information may be used to manage operation of the sputtering system. Managing operation of the sputtering system may include setting an adjustable parameter of a deposition process or deciding when to replace a sputtering target. Machine learning may be used to facilitate use of the time of flight camera in managing the sputtering system operation.

In some of these teachings, the sputtering system is a magnetron sputtering system. In some of these teachings, the time of flight camera is mounted to the pedestal. In some of these teachings, the time of flight camera is recessed behind a substrate-holding surface of the pedestal. In some of these teachings, the time of flight camera is mounted outside the vacuum chamber and the vacuum chamber has a view port between the time of flight camera and the backing plate. In some of these teachings, the time of flight camera has a resolution sufficient to detect nodules on the target surface. In some of these teachings, the time of flight camera includes a vertical cavity surface-emitting laser (VCSEL). In some of these teachings, the time of flight camera is one of a plurality of time of flight cameras positioned to scan the surface of the target held to the backing plate.

Some aspects of the present teachings relate to a method of controlling a sputtering system. The method includes using a time of flight camera to obtain target data relating to topography of a surface of a sputtering target and using the target data to control the operation of the sputtering system. In some of these teachings, the time of flight camera is used to obtain target data relating to topography of the surface of the sputtering target while the sputtering target is within the sputtering system under sub-atmospheric pressure. In some of these teachings, the method includes coating a substrate positioned along a line of sight between the time of flight camera and the target and removing the substrate before using the time of flight camera to obtain the target data. In some of these teachings, using the target data to control the operation of the sputtering system comprises using the target data to determine when to replace the target. In some of these teachings, using the target data to control the operation of the sputtering system includes characterizing a target condition based on the target data and modifying a deposition process parameter of the sputtering system based on the target condition.

Some aspects of the present teachings relate to a method of predetermining a relationship between the target data and a deposition process outcome and using that relationship to control the operation of the sputtering system. The method includes performing a series of sputter coating operations to obtain training data wherein the training data includes coating data relating to properties of coatings produced during the series of sputter coating operations and target training data obtained by examining the surface of the sputtering target using the time of flight camera or another time of flight camera over the course of the series of sputter coating operations. The training data is used to determine a relationship between model inputs that include at least a target condition that may be determined from the target data and at least one model output that may be characterized by the coating data. In some of these teachings, target data is used in conjunction with the predetermined relationship to determine when to replace the target.

In some of these teachings, the training data further includes one or more adjustable deposition process parameters for the sputtering system. In some of these teachings, the training data includes a wear rate for the target. In some of these teachings, using the target data in conjunction with the predetermined relationship to control the operation of the sputtering system involves modifying at least one of the adjustable deposition process parameters. In some of these teachings, the target data is used in conjunction with the predetermined relationship to reduce arcing. In some of these teachings, the target data is used in conjunction with the predetermined relationship to set a target to substrate distance based on the data.

Some aspects of the present teachings relate to a method of operating a coating system that includes placing a sputtering target and a substrate in a chamber, bombarding the target with positively charged ions to cause target material to be ejected, forming a coating on the substrate from the ejected target material, collecting data that includes information provided by a time of flight camera directed at the target, and operating the coating system based on the data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sputtering system, comprising:
a vacuum chamber;
a power source having a pole;
a backing plate for holding a target within the vacuum chamber, wherein the backing plate couples to the pole;
a pedestal within the vacuum chamber, the pedestal including a mounting surface including multiple substrate regions that are configured to simultaneously hold multiple substrates, respectively;
multiple cameras held at fixed locations within the mounting surface of the pedestal and operative to scan a surface of a target held to the backing plate, the multiple cameras being arranged directly within the multiple substrate regions, respectively; and
a computer system that receives data from the multiple cameras and combines the data from the multiple cameras to analyze the surface of the target;
wherein the pedestal and the cameras are arranged such that the multiple substrates when held on the multiple substrate regions, respectively, block respective line-of-sight of the multiple cameras so as to prevent the multiple cameras from scanning the surface;
each of the multiple cameras includes a time of flight camera operative to vary a refractive index in a waveguide so as to scan a beam from the time of flight camera across the surface while the time of flight camera remains at one of the fixed locations.

2. The sputtering system of claim 1, wherein the sputtering system is a magnetron sputtering system.

3. The sputtering system of claim 1, wherein the multiple cameras each include an array of pixels configured to receive separate portions of the beam.

4. The sputtering system of claim 1, wherein each of the time of flight cameras has a resolution sufficient to detect nodules on the surface.

5. The sputtering system of claim 1, wherein each of the time of flight cameras comprises a vertical cavity surface-emitting laser (VCSEL).

6. The sputtering system of claim 1, wherein the multiple cameras have a one-to-one correspondence with the multiple substrate regions, respectively, and are arranged directly beneath the multiple substrates, respectively, when the multiple substrates are simultaneously held on the mounting surface of the pedestal.

7. The sputtering system of claim 1, wherein the backing plate comprises a plurality of magnets that are spaced apart from one another by lateral spacings between outer sidewalls of the magnets, and wherein the multiple cameras are arranged in the pedestal directly under the lateral spacings.

8. A sputtering system, comprising:
a chamber;
a power source that produces a glow discharge within the chamber;
a target within the chamber;
a pedestal within the chamber;
a plurality of substrates arranged simultaneously on the pedestal within the chamber; and
a plurality of cameras installed at a plurality of fixed locations in the pedestal, the plurality of fixed locations being directly under the plurality of substrates, respectively;
wherein the plurality of cameras is positioned to scan a surface of the target when the plurality of substrates is removed from the chamber;
and
each of the plurality of cameras includes a time of flight camera comprising a heater operative to vary a refractive index in a waveguide so as to scan a beam from the time of flight camera across the surface of the target.

9. The sputtering system of claim 8, wherein the sputtering system is a magnetron sputtering system.

10. The sputtering system of claim 8, wherein each of the time of flight cameras has a resolution sufficient to detect nodules on the surface of the target.

11. The sputtering system of claim 8, wherein each of the time of flight cameras includes a vertical cavity surface-emitting laser (VCSEL).

12. The sputtering system of claim 8, wherein each of the time of flight cameras includes an array of pixels configured to receive separate portions of the beam.

13. The sputtering system of claim 8, wherein the plurality of cameras have a one-to-one correspondence with the plurality of substrates, respectively.

14. The sputtering system of claim 8, further comprising:
a computer system that receives data from the plurality of cameras and combines the data from the plurality of cameras to analyze the surface of the target.

15. The sputtering system of claim 8, further comprising:
a plurality of magnets that are arranged over the pedestal and spaced apart from one another by lateral spacings between outer sidewalls of the magnets, and wherein the plurality of cameras are arranged in the pedestal directly under the lateral spacings.

16. A sputtering system, comprising:
a vacuum chamber;
a power source;
a backing plate operative to hold a target within the vacuum chamber;
a pedestal operative to support multiple substrates within the vacuum chamber; and
multiple cameras arranged at fixed locations in the pedestal and operative to scan a surface of a target held to the backing plate, the fixed locations of the multiple cameras corresponding in a one-to-one manner with and being directly under the multiple substrates, respectively;
wherein the power source is coupled to the backing plate;
the pedestal holds the multiple substrates in positions where the multiple substrates protect the multiple cameras from sputter deposition; and
each of the multiple cameras includes a time of flight camera comprising a heater operative to vary a refractive index in a waveguide so as to scan a beam from the time of flight camera across the surface of the target.

17. The sputtering system of claim 16, wherein each of the time of flight cameras includes an array of pixels.

18. The sputtering system of claim 16, a computer system that receives data from the multiple cameras and combines the data from the multiple cameras to analyze the surface of the target.

19. The sputtering system of claim 16, wherein the backing plate comprises a plurality of magnets that are spaced apart from one another by lateral spacings between outer sidewalls of the magnets, and wherein the multiple cameras are arranged in the pedestal directly under the lateral spacings.

20. The sputtering system of claim 16, wherein the sputtering system is a magnetron sputtering system.

* * * * *